(12) United States Patent
Dayan

(10) Patent No.: US 9,316,676 B2
(45) Date of Patent: Apr. 19, 2016

(54) SYSTEM AND METHOD FOR MONITORING AN ELECTRICALLY-CONNECTED SYSTEM HAVING A PERIODIC BAHAVIOR

(71) Applicant: Prosper Dayan, Kiryat Chaim (IL)

(72) Inventor: Prosper Dayan, Kiryat Chaim (IL)

( * ) Notice: Subject to any disclaimer, the term of this patent is extended or adjusted under 35 U.S.C. 154(b) by 0 days.

(21) Appl. No.: 14/299,576

(22) Filed: Jun. 9, 2014

(65) Prior Publication Data

US 2015/0355255 A1 Dec. 10, 2015

Related U.S. Application Data

(63) Continuation of application No. 13/567,159, filed on Aug. 6, 2012, now abandoned.

(51) Int. Cl.
*G01R 31/34* (2006.01)
*G01R 31/02* (2006.01)
*G01M 99/00* (2011.01)

(52) U.S. Cl.
CPC ............. *G01R 31/02* (2013.01); *G01M 99/008* (2013.01)

(58) Field of Classification Search
CPC ...... G01R 31/343; G01R 31/00; G01R 21/06; G01R 23/02; G01R 31/34; G05B 23/0229; G05B 23/0245; G05B 23/0254; G05B 13/04; G06F 17/00; G06F 17/10; H02P 29/021; H02P 21/14; H02P 6/001; Y04S 10/30; Y04S 10/265; Y04S 10/522; Y04S 20/36
USPC ........... 702/58, 57, 59, 64–67, 72–73, 75–76, 702/81, 84, 108, 120, 123, 127, 182–183, 702/185, 189–190; 703/2–4, 18, 20, 22; 324/76.11, 76.19, 76.22, 76.39, 76.41, 324/76.52, 76.77, 86, 107, 765.01; 700/28–32, 47–50, 286, 291, 293–294
See application file for complete search history.

(56) References Cited

U.S. PATENT DOCUMENTS 6,014,598 A * 1/2000 Duyar et al. ..................... 702/58
6,590,362 B2 * 7/2003 Parlos et al. .................. 318/799
(Continued)

FOREIGN PATENT DOCUMENTS

WO   WO 0004359 A1 * 1/2000
WO   WO 2004017038 A1 * 2/2004

OTHER PUBLICATIONS

Cho et al., Fault Detection and Isolation of Induction Motors Using Recurrent Neural Networks and Dynamic Bayesian Modeling, Mar. 2010, IEEE Transactions on Control Systems Technology, vol. 18, No. 2, pp. 430-437.*
Chong et al., Machinery Condition Monitoring Using LPC Residual Signal Energy, 2005 IEEE, pp. 721-723.*
(Continued)

*Primary Examiner* — Toan Le
(74) *Attorney, Agent, or Firm* — 1st-Tech-Ideas.com; Haim M. Factor

(57) ABSTRACT

A method for monitoring a system having an electrical connection, the connection having at least two phases and respective currents, the system having a periodic behavior, the method including the steps of: connecting sensors to measure respective currents of two phases of the electrical connection; transforming the measured currents to create initial current information; making an initial determination of a normal operation of the system; performing training and modeling of the system, following the initial determination of normal operation of the system, the training and modeling including further current measurements yielding modeled current information; monitoring the system, including instant current measurements to yield instant current information indicative of instant operation status of the system; and making an instant determination of operation status of the system by comparing the instant current information with the modeled current information.

15 Claims, 9 Drawing Sheets

(56) References Cited

U.S. PATENT DOCUMENTS

| | | | |
|---|---|---|---|
| 6,713,978 B2 * | 3/2004 | Parlos et al. | 318/268 |
| 7,024,335 B1 * | 4/2006 | Parlos | 702/182 |
| 2003/0065634 A1 * | 4/2003 | Parlos et al. | 706/15 |
| 2003/0067277 A1 * | 4/2003 | Parlos et al. | 318/254 |

OTHER PUBLICATIONS

Govindaraj et al., Speed Control of Induction Motor Using Fuzzy Logic Control, Jan. 2014, International Journal of Innovative Research in electrical, Electronics, Instrumentation and Control Engineering, vol. 2, Issue 1, pp. 830-836.*

* cited by examiner

SYSTEM AND METHOD FOR MONITORING AN ELECTRICALLY-CONNECTED SYSTEM HAVING A PERIODIC BAHAVIOR

This continuation application claims priority from currently-pending U.S. patent application Ser. No. 13/567,159, filed 8 Aug. 2012, whose disclosure is incorporated herein by reference.

FIELD AND BACKGROUND OF THE INVENTION

Embodiments of the current invention are related to a system and method for monitoring an electrically-connected system having a periodic behavior and for identifying deficiencies in such an electrically-connected system.

In the specification and claims which follow, the expression "electrically-connected" is intended to mean any electrical or mechanical device or system which is a) electrically powered; b) provides/generates electrical power; or c) has characteristics of a combination of being electrically powered and providing electrical power. Exemplary electrically-powered devices/systems include, inter alia, motors and lighting devices. Exemplary electrically-generating devices include, inter alia, generators and turbine systems. Exemplary combination electrically powered and electrically generating systems include, inter alia, hybrid vehicles as known in the art. In the specification and claims which follows, the terms "motor" and "machinery" are intended to mean the electrically powered devices/systems, as noted hereinabove.

Various diagnostic systems have been developed for the early warning of fault detection in electrically-connected rotating machinery/equipment. Many of these diagnostic systems include accelerometers, to collect the mechanical vibrations/waves emitted by the rotating machine, and a control unit to numerically analyze collected waves in the frequency domain. The diagnostic systems typically comprise a sensor or a plurality of sensors and a control unit, as known in the art. The sensors are usually positioned in the vicinity of the rotating parts to be diagnosed, or upon the rotating parts themselves, and the sensors are typically connected electrically to a control unit via cables/wires. As a result, such monitoring/diagnostic systems require a large space within the machinery "envelope", which represents an additional space burden for the machinery/equipment.

Examples of diagnostic systems are described in PCT patent applications WO 04/017038 and WO 00/04359, whose disclosure are incorporated herein by reference.

Recently, fault detection and diagnosis (FDD) methods have been developed that compare output signals of a complex system with an output signal obtained from a mathematical model of the same fault-free system. The comparison between the signals of the mathematical model and those of the complex system is quantified in terms of one or more "residuals", i.e. one or more values representing the difference between the two. An analysis of the residual is performed to determine a type of system fault. The analysis includes statistical methods employed to compare the residuals against a database of residuals for systems with known faults.

Until recently it has been difficult to obtain accurate, real-time models for multivariable systems, meaning systems having more than one input and/or one output. If the model of a system is not accurate, the residuals will reflect modeling errors that are very difficult to separate from the effect of actual faults.

Duyar Ahmet et al. in U.S. Pat. No. 6,014,598, whose disclosure is incorporated herein by reference, describe a model based fault detection system and method for monitoring and predicting maintenance requirements of electric motors. The system includes a computer means coupled to sensors which provide continuous real-time information of the input voltage and current and motor speed. The system and method utilize a multivariable experimental modeling algorithm to obtain a mathematical description of the motor. The algorithm compares the modeled result with a measured result and quantifies the comparison in terms of a residual which is generated by subtracting the respective signals. A diagnostic observer analyzes the residual and determines if the motor is fault free or operating in a manner other than fault free. Upon detection of the impending fault, the diagnostic observer evaluates the measured variables of the motor, determines the deviation from the reference value and develops a diagnosis of the likely failed or failing component.

Parlos Alexander et al. in U.S. Pat. No. 6,713,978 and U.S. patent application 2003/0065634, whose disclosure is incorporated herein by reference, describe a non-linear, semi-parametric neural network-based adaptive filter which is utilized to determine the dynamic speed of a rotating rotor within an induction motor, without the explicit use of a speed sensor, such as a tachometer. The neural network-based filter is developed using actual motor current measurements, voltage measurements, and nameplate information. The neural network-based adaptive filter is trained using an estimated speed calculator derived from the actual current and voltage measurements. The neural network-based adaptive filter uses voltage and current measurements to determine the instantaneous speed of a rotating rotor. The neural network-based adaptive filter also includes an on-line adaptation scheme that permits the filter to be readily adapted for new operating conditions during operations.

Parlos et al., in U.S. Pat. No. 6,590,362 and in US patent application 2003/0067277, whose disclosure is incorporated herein by reference, describe a method and system for early detection of incipient faults in an electric motor. First, current and voltage values for one or more phases of the electric motor are measured during motor operations. A set of current predictions is determined via a neural network-based current predictor based on the measured voltage values and an estimate of motor speed values of the electric motor. A set of residuals is generated by combining the set of current predictions with the measured current values. A set of fault indicators is subsequently computed from the set of residuals and the measured current values. Finally, a determination is made as to whether or not there is an incipient electrical, mechanical, and/or electromechanical fault occurring based on the comparison result of the set of fault indicators and a set of predetermined baseline values.

Additionally, Parlos in U.S. Pat. No. 7,024,335, whose disclosure is incorporated herein by reference, describes assessing the condition of a device includes receiving signals from a sensor that makes electrical measurements of the device. An expected response of the device is estimated in accordance with the received signals, and a measured response of the device is established in accordance with the received signals. An output residual is calculated according to the expected response and the measured response. The condition of the device is assessed by identifying a fault of the device in accordance with the output residual.

There is therefore a need to facilitate simplified and lower cost implementation of monitoring and identifying deficiencies in an electrically-connected system having a periodic behavior.

SUMMARY OF THE INVENTION

According to the teachings of the present invention there is provided a method for monitoring a system having an electrical connection, the connection having at least two phases and respective currents, the system having a periodic behavior, the method comprising the steps of: connecting sensors to measure respective currents of two phases of the electrical connection; transforming the measured currents to create initial current information; making an initial determination of a normal operation of the system; performing training and modeling of the system, following the initial determination of normal operation of the system, the training and modeling including further current measurements yielding modeled current information; monitoring the system, including instant current measurements to yield instant current information indicative of instant operation status of the system; and making an instant determination of operation status of the system by comparing the instant current information with the modeled current information. Preferably, the initial current information includes: a normalized correlation frequency spectrum; a non-trivial frequency spectrum derived from the normalized frequency spectrum; and a root-mean-square calculation of the non-trivial frequency spectrum. Most preferably, the initial determination of normal operation of the system further comprises an initial threshold check whereby the root mean-square of the non-trivial spectrum is compared to a threshold value. Typically, no training, modeling, and monitoring of the system are performed when the initial threshold check is not successful. Most typically, the initial determination of normal operation of the system is completed in a time period ranging substantially from 30 to 180 minutes.

Preferably, modeled current information includes a coefficient vector and a training feature table. Most preferably, instant current information includes an instant feature table. Typically, a residual energy is calculated based on the instant current information and the modeled current information and the residual energy is compared to at least one threshold to make the instant determination of operation status. Most typically, training and modeling is completed in a time period ranging substantially from 36 to 100 hours.

According to the teachings of the present invention there is further provided a monitoring system for monitoring a system having an electrical connection, the connection having at least two phases and respective currents, the system having a periodic behavior, the monitoring system comprising: at least two current sensors adapted to be connected to the at least two phases and to measure respective currents of the at least two phases; an A-to-D converter connectable to the current sensors and adapted to digitize the measured currents; a PC host connectable to the A-D converter and adapted to process the digitized measured currents to: create initial current information indicative of initial normal operation of the system; perform training and modeling of the system, following the indication of normal operation of the system, to yield modeled current information; and monitor the system with instant current measurements to yield instant current information indicative of instant operation status of the system wherein the monitoring system is adapted to make a determination of instant operation status of the system based on a comparison of the instant current information with the modeled current information. Typically, the initial current information includes: a normalized correlation frequency spectrum; a non-trivial frequency spectrum derivable from the normalized frequency spectrum; and a root-mean-square calculable from the non-trivial frequency spectrum. Most typically, normal operation of the system is determinable based upon a comparison of the root mean-square and a threshold value. Preferably, the indication of initial normal operation of the system is completable in a time period ranging substantially from 30 to 180 minutes.

Most preferably, modeled current information includes; a coefficient vector and; a training feature table. Typically, instant current information includes and an instant feature table. Most typically, a residual energy is calculable, based on the instant current information and the modeled current information. Preferably, the instant operation status of the system is determinable based upon a comparison of the residual energy and at least one threshold.

BRIEF DESCRIPTION OF THE DRAWINGS

The invention is herein described, by way of example only, with reference to the accompanying drawings, wherein.

DETAILED DESCRIPTION OF EMBODIMENTS

Figure 1:
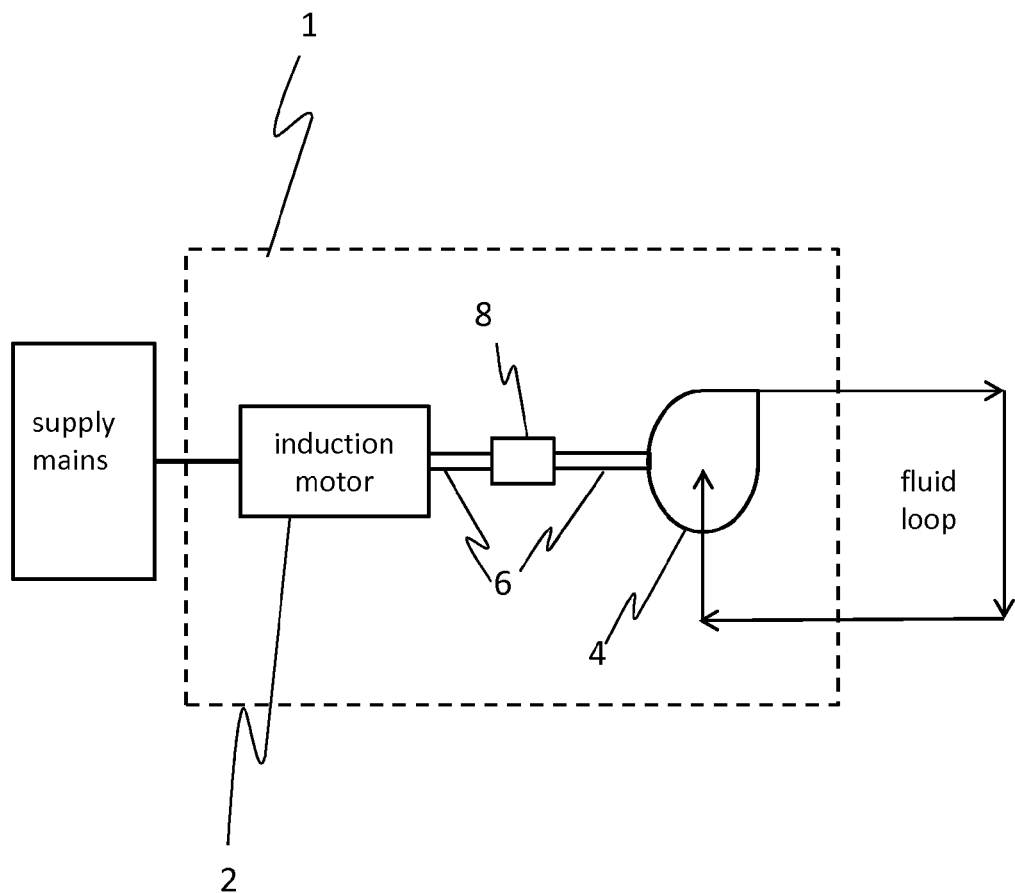
FIG. 1 is an illustration of a system for electric pump fault detection according to the Prior Art.

Embodiments of the current invention are related to a system and method for monitoring an electrically-connected system having a periodic behavior and for identifying deficiencies in such an electrically-connected system—such as, but not limited to, an electric motor.

Embodiments of the present invention additionally provide a novel stand-alone monitoring system, integrating two ROGOWSKI current transformers fixed together with the monitoring system in the vicinity of the electrical board of an electrically-powered system. The integrated current transformers eliminate a need for wire/cable connection and facilitate placement of the monitoring system equipment along with or remotely from the monitored system. The monitoring system can perform signal measurement and analyses (using an industrial processor) and results can be directly transmitted (via wires or wireless means) to a central station location. The monitoring system of embodiments of the invention comprises an autonomous electronic system which may be mounted as a stand-alone unit configured to remotely monitor an electrically-connected system.

Therefore, there is provided an autonomous electronic system, which may be used to exemplarily monitor an electrically-connected system. The system comprises two current sensors outputting two respective analog two-phase signals (from the 3 phase AC electrical power supply) indicative of the operation of the rotating part; a preamplifier; an Analog-to-Digital (A-to-D) converter configured to receive the analog signals from the current sensors; a control unit configured for applying a spectral analysis to the signal outputted by the A-to-D converter to determine an abnormality in the operation of at least one of the rotating parts, and a communication unit configured to transmit a final diagnosis result, wherein the 2 current transformers (sensors), the preamplifier, the A-to-D converter, the control unit, and the communication unit are mechanically integrated parts and form a single autonomous unit.

In some embodiments of the current invention, the control unit comprises hardware and/or software modules.

Embodiments of the current invention include a system configured to monitor any electrically-connected devices and system having a periodic behavior, such as, but not limited to machinery having a periodic behavior. Examples of such systems are power plants, wind turbines, any turbine (jet, fan, prop), combustion and electrical engines, generators, gearboxes, accessories such as pumps, fan coolers, compressors, rotors, rotor blades, shafts, bearings, inter alia.

Embodiments of the current invention include the monitoring system being configured to detect deficiencies such as mechanical faults such as, but not limited to: shaft imbalance; foreign object damage (FOD); internal object damage (IOD); wheel tooth fracture; wheel tooth wear; housing fracture/deformation; bearing races pitting/spalling; bearing cage fracture; ball bearing seizure; chips; coupling cracks; blade fracture/deformation/cracks; and support fracture—all at an early stage before serious failures. The system can also be utilized for emergency early warning and for Condition Based Maintenance (CBM).

According to another broad aspect of embodiments of the present invention, a method is provided for creating a current transformer-related database corresponding to component features of proper functioning of a device or system; sensing electrical current measurements corresponding to mechanical vibrations produced by individual parts of a mechanical system during operation; comparing the sensed measurements with the current database using narrow band spectral analysis; and identifying the device or specific part of the system in which malfunctions occur and the type of malfunction. In the specification and claims which follow hereinbelow, the term "component feature" is intended to mean a characteristic amplitude-frequency behavior associated with a respective mechanical component of a system or of a device. Every frequency has its respective energy level, taken from the entire frequency spectrum.

According to another embodiment of the current invention, sensed current values, corresponding to indications of a malfunctioning component are also included in the current database. The current database can also be created during operation of a mechanical system, rather than being entered in advance. Health measures indicating the development of an impending malfunction can be transmitted (wirelessly or by wire) to a central control station or to a responsible person to take proper action.

Reference is currently made to FIG. 1, which is an illustration of a system 1 for electric pump fault detection, according to the Prior Art. System 1 comprises a driver—which is an induction motor 2—and a driven load—which is a centrifugal pump 4, which typically circulates a fluid. Pump 4 is connected to motor 2 by means of shafts 6 and a mechanical coupling 8. If motor 2 and pump 4 are both "healthy", system 1 performs as per design specifications, and an output of motor 2 (i.e. torque) would be as per the specifications. Similarly, in a healthy system, outputs of pump 2, namely a flow rate and a pressure difference, would be as per characteristics curves of pump 4 provided by the manufacturer.

However, if motor 2 has a fault, the output torque may be the same as compared to that of a normal (i.e. "healthy") motor but the output torque of the faulty motor has extra harmonics correlating to the fault. Similarly, if pump 4 is not healthy, then it does not produce a required work (i.e., horsepower). Moreover, the torque transmitted from motor 2 to pump 4 is also influenced by the speed of pump 4. Hence, a fault in either pump 4 or motor 2 has an effect on the torque produced by the induction motor. Any changes in the torque of motor 2 are reflected in changes in the currents (not indicated in the figure) of motor 2.

Figure 2:
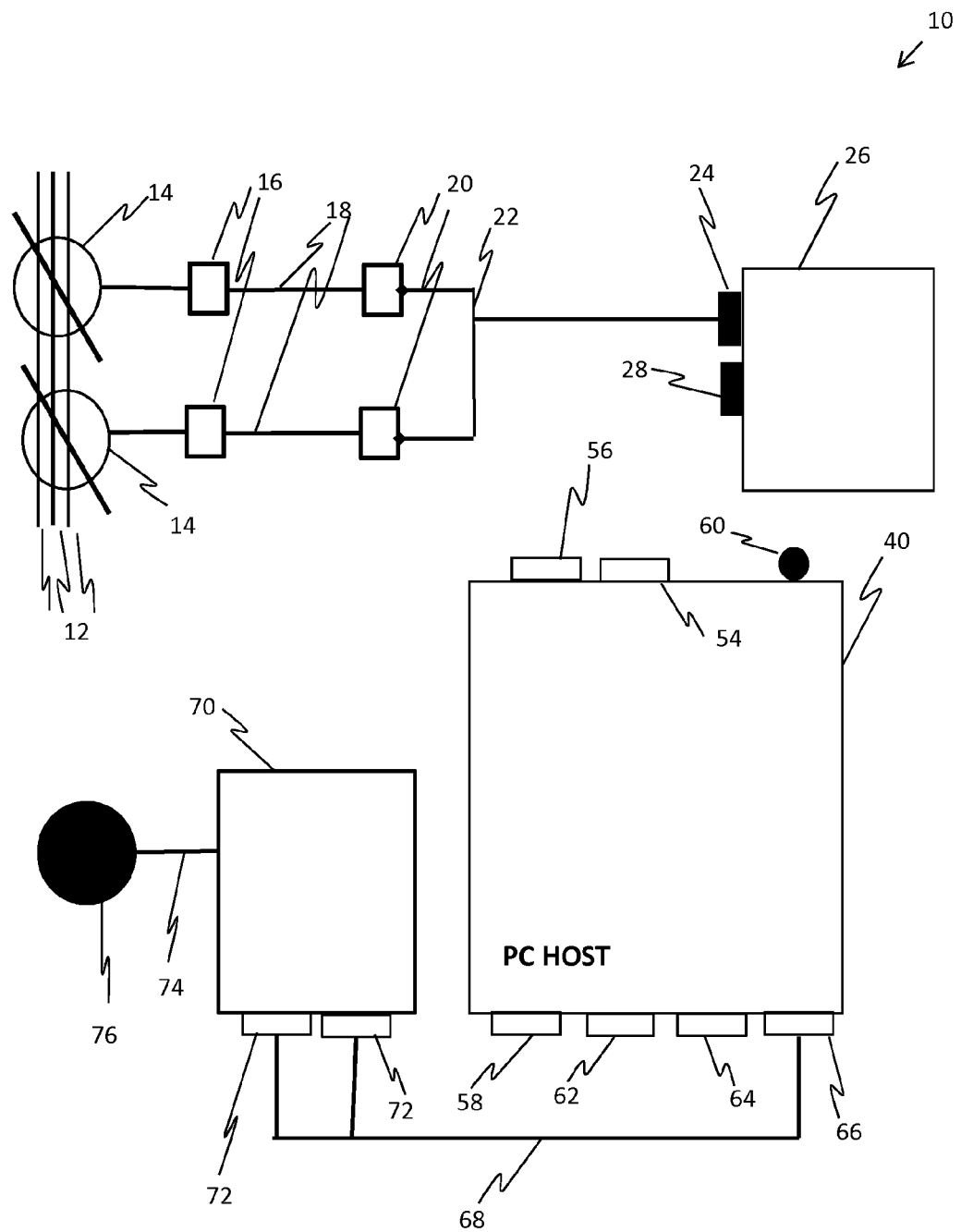
FIG. 2 is a schematic flowchart of steps in a monitoring system, in accordance with an embodiment of the present invention.
Figure 3:
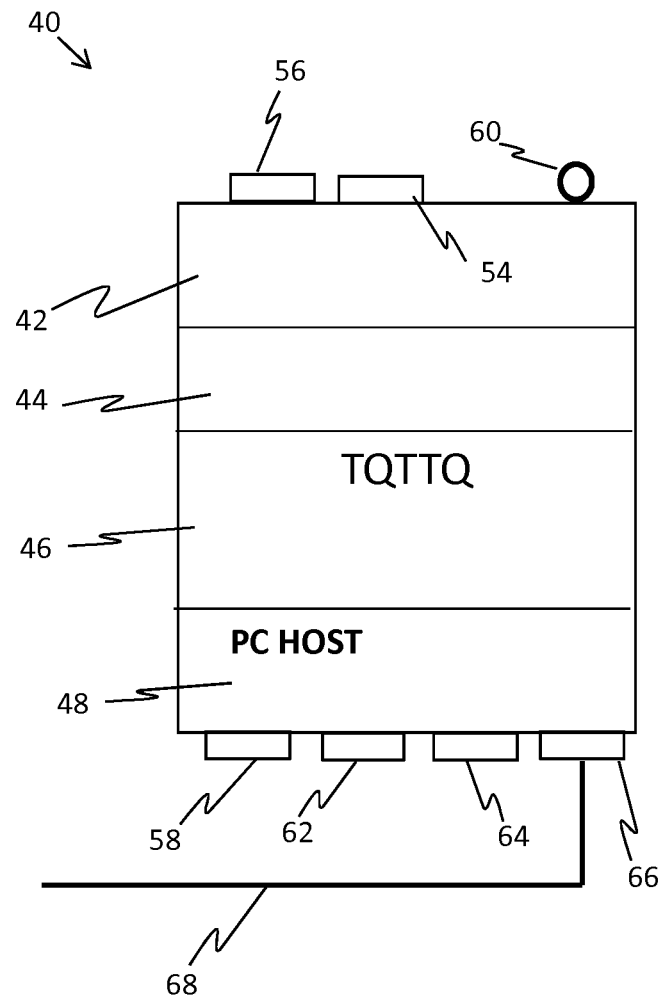
FIG. 3 is a schematic flowchart of a preamplifier, an A-to-D converter, a control unit and a communication unit, integrated into an autonomous unit in accordance with an embodiment of the present invention.

Reference is made to FIGS. 2 and 3, which are schematic block diagrams of a monitoring system 10, and details of PC host 40, in accordance with embodiments of the present invention. In the specification and claims which follow, the expression "PC host" is intended to mean any computing device as known in the art including, but not limited to: a desk top computer; a laptop computer; a smartphone; and a server computer.

Monitoring system 10 may be used for monitoring electrically-connected equipment having periodic behavior—such as, but not limited to electro-mechanical having at least one rotating part. An exemplary application of monitoring system 10 is to monitor an electrically powered motor—not shown in the figures.

Monitoring system 10 is configured as a stand-alone unit, directly attachable to or located in the vicinity of an electrical board (not shown in the figures) which belongs to a mechanical system and the monitoring system can sense and analyze signals (e.g. using an industrial processor without moving parts) and produce results, all as described hereinbelow.

System 10, according to one broad embodiment of the present invention, measures AC current using two current sensors 14—current transformers (e.g. ROGOWSKI coils) for measuring current from distribution lines 12 of the electromechanical powered system, for example, a 3-phase electrical motor (not shown in the present figure, but similar to motor 2 of FIG. 1). Current sensors 14 have a frequency response in a range of about 10 Hz to 50,000 Hz. Current sensors 14 are equipped with two safe sockets 16 for ROGOWSKI coil cable ends and are connected by cables 18 having a length of approximately 1 meter to a BNC socket 20 and further to an adaptor 22. Adaptor 22 is made as a 2×BNC-to-PL two adaptors (high quality with Ferrite). Adaptor 22 is connected by a microphone socket 24 to USB Sound Card 26, which also has a headphone socket 28.

According to a preferred embodiment of the present invention, PC host 40 is a TQ-Mini unit and schematically consists of: a preamplifier 42, an A-to-D converter 44 (e.g. sampling card), a control unit 46 (e.g. processor or microprocessor) and a communication unit 48 (e.g. wireless communication card), for transmitting final results, as described further hereinbelow.

PC host 40 is supplied with USB sockets 54, 56, 58, a light signal 60, a VGA outlet 62, LAN outlet 64 and a power inlet 66 for a DC 5V small USB. A USB Cord 68 connects small USB Power inlet 66 with a transformer 70 (typically 5V DC) via a USB splitter 72—two USB inlets. Transformer 70 is connected by a wire 74 having a plug 76, for electrical supply to PC host 40. Exemplary electrical supply value is 110 and 220V AC. Monitoring system 10 can be connected to a DC power supply (not shown in the figures).

Current sensors 14 are an integrated part of monitoring system 10. Cables 18, having a typical length ranging from 0.5 to 2.0 m, but less than approximately 3 m are used. One of the advantages of the configuration shown in FIGS. 2 and 3 is that only one location of system 10 is required within device or system being monitored—generally yielding, inter alia, shorter cabling lengths, as opposed to much larger devices for monitoring, based on accelerometers.

In some embodiments, system 10 does not have moving parts so as to avoid internal background noise and vibrations. Likewise, control unit 46 has a flash memory (not shown in the figure)—as opposed to a hard drive—and control unit 46 can be configured without a cooling fan for its processor. Control unit 46 serves to identify the presence of failures and/or of faulted mechanical components of the monitored system/device, and to give earlier alerts for possible future failures using spectral analysis—as further described hereinbelow.

Monitoring system 10 is placed near the monitored system/device being monitored (referred to alternatively hereinbelow as "machinery") and performs the following operations, as further described hereinbelow:

a) Measurement of incoming currents feeding the machinery;

b) Analyses of the spectral features of current measurements;

c) Performing a decision process ("normal"/"abnormal" operation); and d) Sending results to a central station (i.e. control center—not show in the figures)

In some embodiments, of the current invention, to compensate measured sound level spectral features, monitoring system 10 has an optional data collection bus (not shown in the drawings) originating from the machinery. Examples of data collected are: rotation speed, torque, air velocity, ambient pressure, ambient temperature, elevation/altitude, fuel consumption, pitch roll or yaw angles, speeds or accelerations, inter alia.

Monitoring system 10 can include a data acquisition card with an anti-aliasing filter. The data acquisition module can be configured as a high performance sound and vibration A-to-D measurement card. The data acquisition card is a Peripheral Component Interconnect (PCI) connected to a PCI slot in the fan-less industrial processor but can be also connected via USB 54.

Communication unit 48 serves to deliver a final diagnosis result to control unit 46 via wire or a wireless connection. The wireless connection can be configured as an IEEE 802.11n WLAN, or RF transmitter/receiver, GPRS, or satellite communication. Control unit 46 can be monitored via a remote connection through communication unit 48. The technique of monitoring can also be updated via communication unit 48.

As noted previously, the output of preamplifier 42 delivers signals to Analog-to-Digital (A-to-D) converter 44 configured to receive these analog signals from current sensors 14. Output signals of current sensors 14 are sampled and converted to a series of digital signals by an analog to digital (A-to-D) converter 44 having a suitable sampling frequency. Then digital signals are delivered to control unit 46, which is configured for applying a spectral analysis to the signal outputted by A-to-D converter 44 to determine an abnormality in the operation of at least one of the electromechanical machine rotating parts. Analog to digital (A-to-D) converter 44 is coupled to a microprocessor (not shown in the figure) of control unit 46 where the sampled data are stored for a predetermined period. Control unit 46 then analyses the delivered signal in comparison with the data received from the mentioned electrical-related database using mathematical and statistical tools (e.g. narrow band spectral analysis) and identifies a specific part of the machinery with malfunctions and identifies the type of deficiency.

Figure 4:
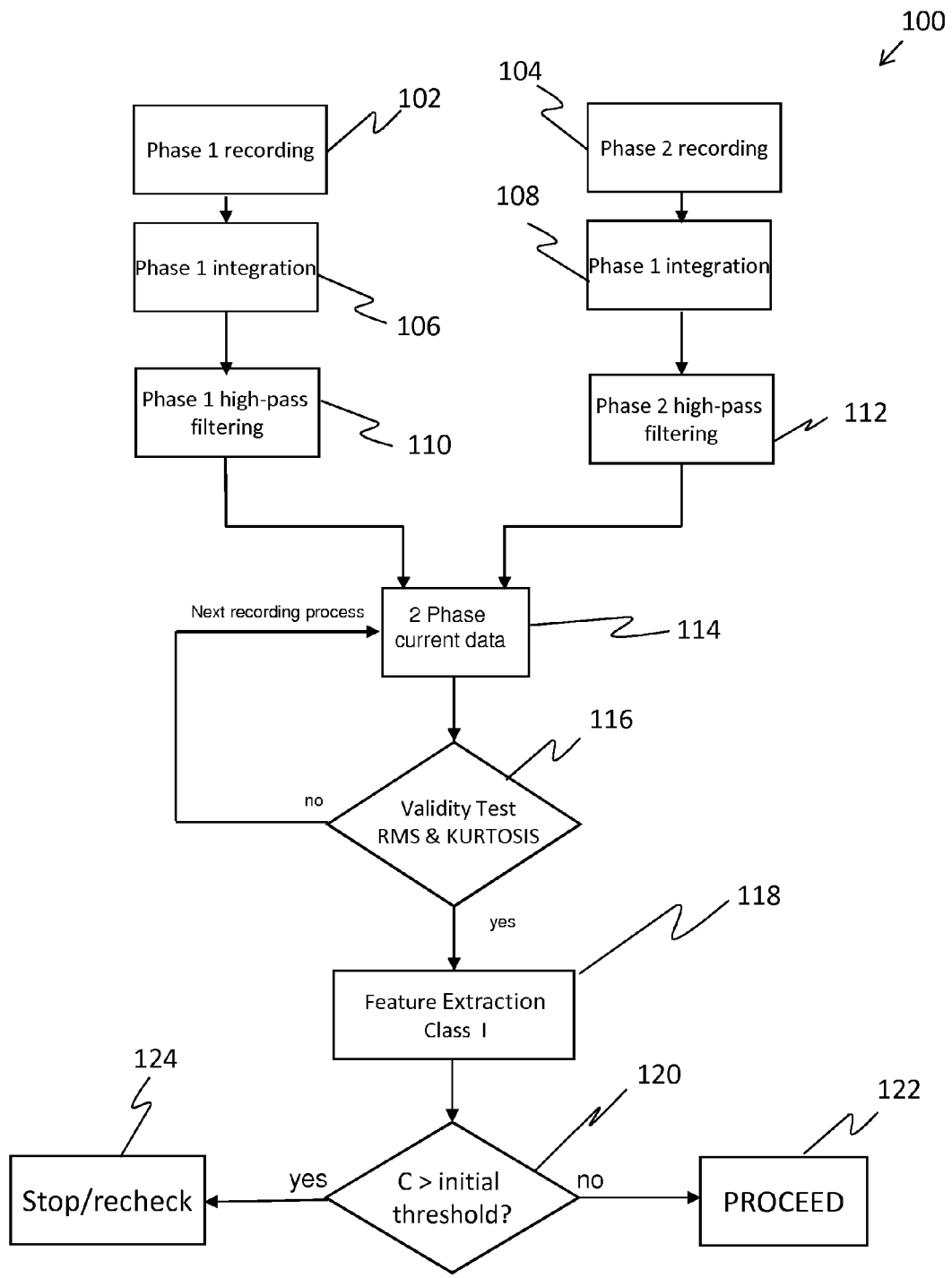
FIGS. 4-6 are flow diagrams serving, together, to describe a method of monitoring an electrically-connected system having a periodic behavior, in accordance with an embodiment of the present invention.
Figure 5:
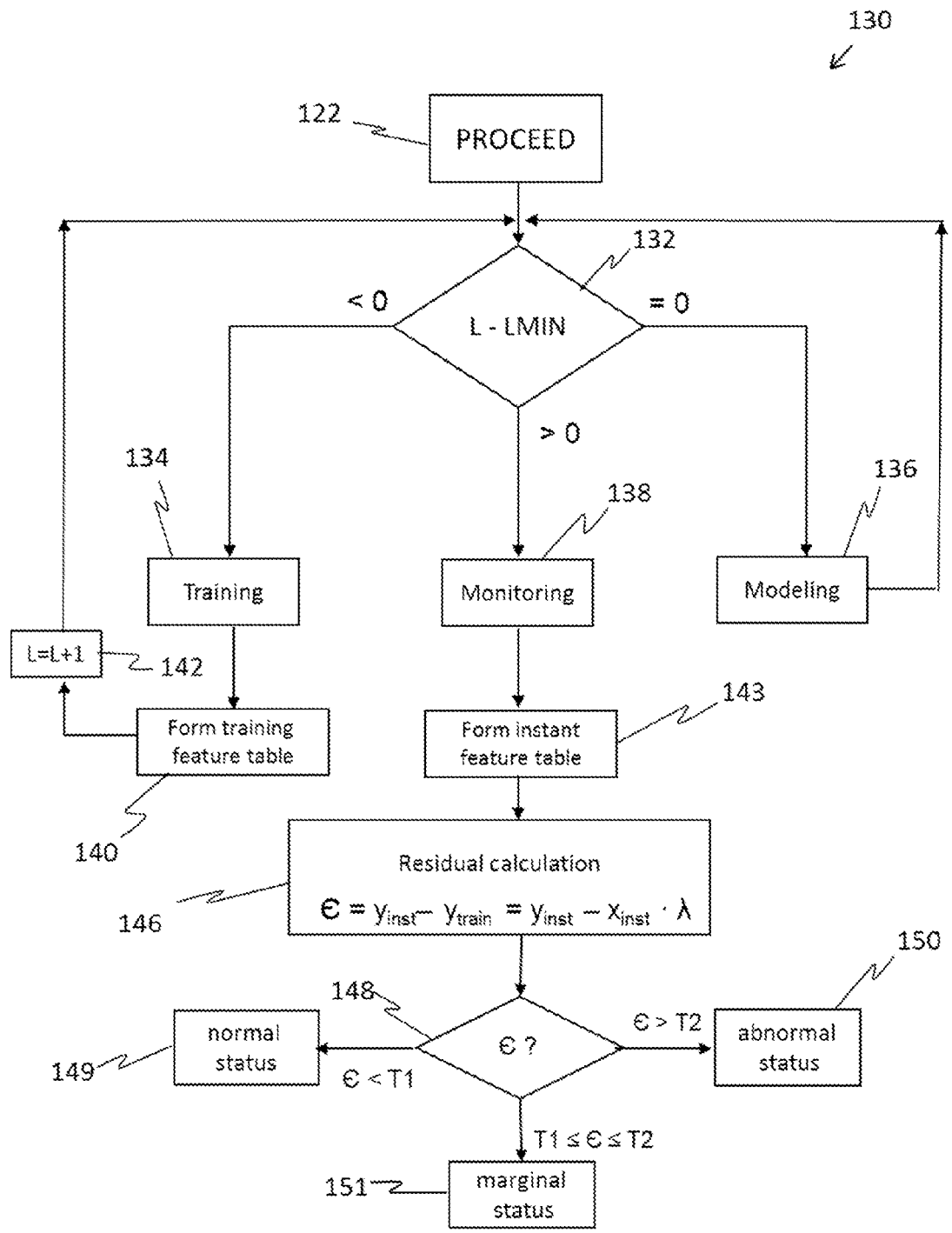
Figure 6:
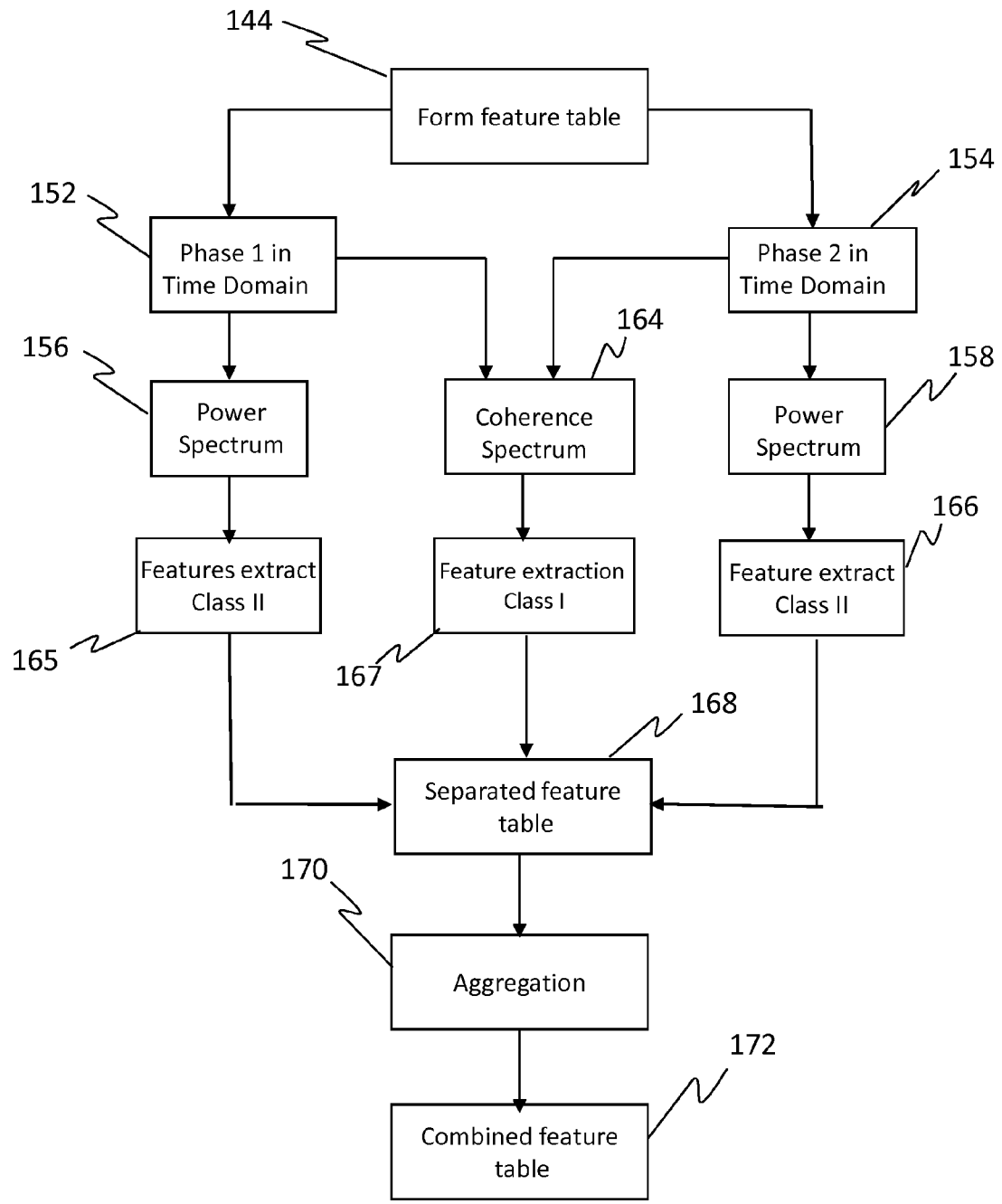
Figure 7:
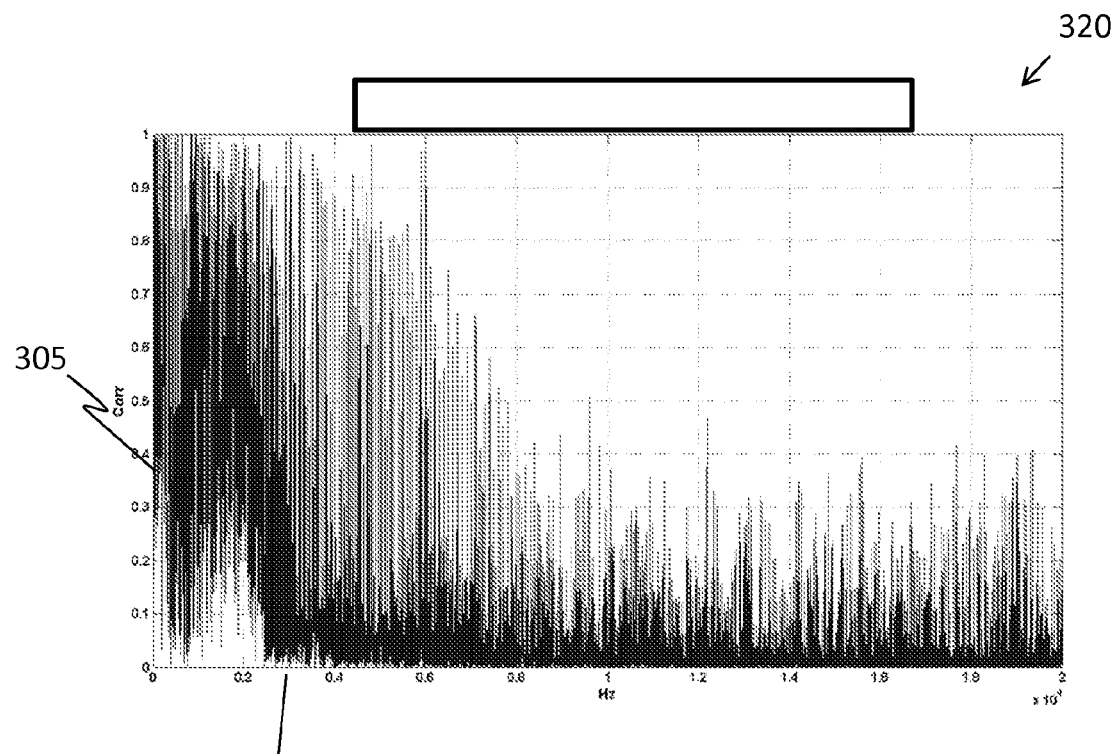
FIGS. 7-11 are plots of coherence versus frequency, showing a normal operation (FIGS. 7-8) and an abnormal operation (FIGS. 9-11) of an exemplary electric motor, as part of the initial threshold check of FIG. 4 of the monitoring system, in accordance with embodiments of the current invention.
Figure 8:
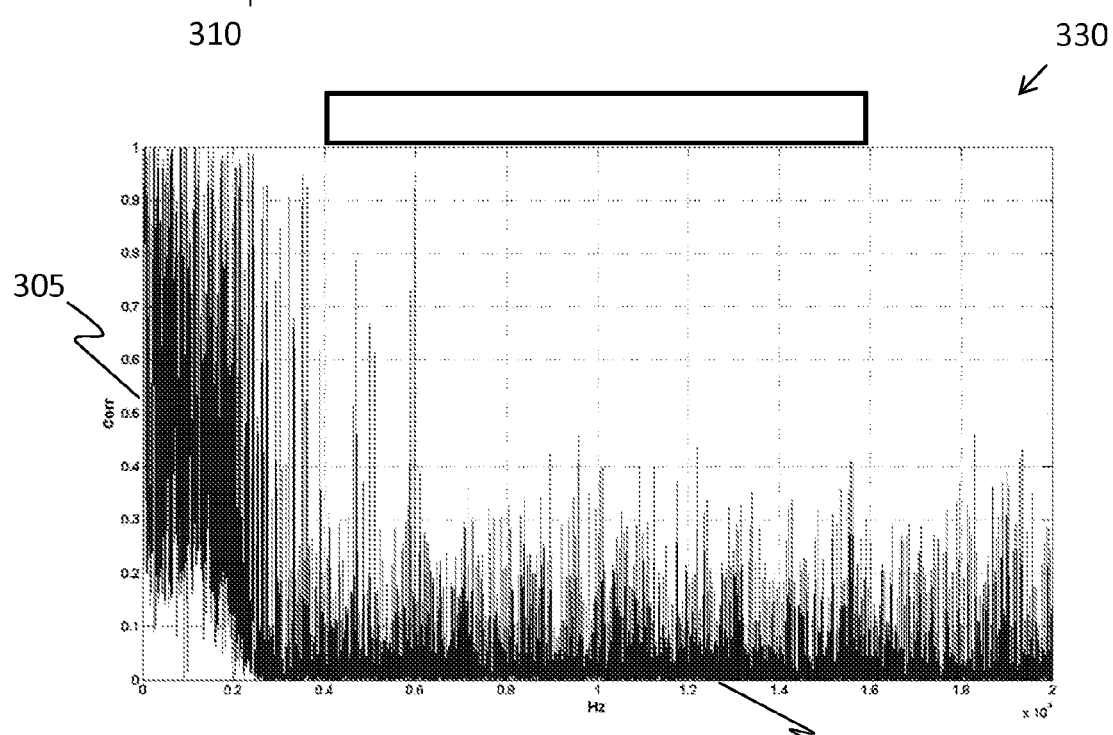

Reference is presently made to FIGS. 4-6, which are flow diagrams serving, together, to describe a method of initially checking and then monitoring an electrically-connected system having a periodic behavior, such as, but not limited to, a rotating part of a mechanical system, in accordance with embodiments of the present invention. The method is described hereinbelow, with reference to elements identified in FIGS. 2-3.

In FIG. 4 is a schematic flowchart showing algorithm 100, which is a series of steps performed to initially determine whether the system being monitored (in this case, a motor) is considered "normal" or "not normal". The determination is important because subsequent monitoring steps are valid only when compared to a "normal" system. Should the system be initially determined as "not normal", the system must then be further checked and/or other actions may be necessary.

Algorithm 100, which including a step referred to hereinbelow as "initial threshold check", preferably takes a number of minutes and typically less than a few hours to complete—as opposed to other prior art methods which could take days to complete. The significantly reduced time for the determination of "normal"/"not normal" system, in accordance with embodiments of the current invention, not only saves time and resource allocation, but also intrinsically contributes to a more reliable determination—as the system itself my undergo changes during extended testing/sampling.

In algorithm 100, steps 102 and 104, Phase 1 recording and Phase 2 recording, respectively, analog signals from the alternating current supply for two current phases of an exemplary 3-phase motor (not shown in the figures) are recorded, as described hereinabove in FIGS. 2 and 3. Respective recorded analog signals are then converted to discrete current signals in A-to-D converter 44 to which constant parameters are applied. The parameters characterize the process of conversion of analog signals to discrete signals, i.e. the sampling/monitoring rate and the time period of the signal subjected to conversion, as known in the art. A typical monitoring rate may be 50 KHz, and a typical time period for sampling may range from approximately 1 to 24 seconds, with an optimal time period of approximately 12 seconds.

In respective steps 106 and 108, Phase 1 integration and Phase 2 integration, respectively, recorded digital signals from previous respective steps 102 and 104 are currently integrated, to obtain digital values representing the actual respective currents. Following this, in steps 110 and 112, Phase 1 high pass filtering and Phase 2 high pass filtering, respectively, are performed on the integration results to effectively remove DC effects from integration, as known in the art. This yields "2 phases of current data" (i.e. initial, digitized current data from 2 phases, before subsequent mathematical manipulation and analyses, as described hereinbelow) in step 114, In step 116, Validity Test RMS & Kurtosis, digital current data from the 2 phases of current data of step 114 are statistically transformed, as known in the art—where RMS is the 2nd moment and Kurtosis is the 4th moment of the current data. A validity test result is assessed as "Yes" or "No", as known in the art.

If the validity test result of step 116 is "No", control is returned to step 114 and the next signal recording is evaluated. If the validity test result of step 116 results is "Yes", then the present signal results are passed to step 118, Features Extraction Class 1, according to the following operations:

a. Using the last recorded measured digital current values, a normalized correlation $C_{12}(f)$, frequency spectrum is created, as known in the art, according to:

$$C_{12}(f)=|P_{12}(f)|^2/P_{11}(f)P_{22}(f)$$

Where:
f=frequency
$P_{12}$=cross power spectrum of the two signals, phase1 and phase2
$P_{11}$=power spectrum of phase 1
$P_{22}$=power spectrum of phase 2 b. Features are then extracted from the above frequency spectrum corresponding to trivial frequencies and a root-mean-square is then calculated for the resultant spectrum, schematically according to the relation:

$$C = RMS(\Sigma c_{non-trivial\ frequencies})$$

The normalized correlation frequency spectrum, the frequency spectrum having corresponding trivial frequencies extracted and the root-mean-square calculation, all as described hereinabove, are collectively referred to hereinbelow as "initial current information".

After step 118, control is transferred to step 120, C>initial threshold. Step 118 is also referred to in the specification and claims with follow hereinbelow as an "initial threshold check". (Additional discussion of the initial threshold, including examples, follows hereinbelow in description of FIGS. 7-11.)

If the answer to "C>initial threshold?" is "no" in step 120, then the monitored motor is OK, and the initial threshold check is successful. Control is transferred to step 122, PROCEED. Training, modeling, and routine monitoring of the system being monitored presently take place, as described hereinbelow in algorithm 130, shown in FIG. 5.

If the result of step 120 is "yes", the monitored motor is not OK (i.e., the initial threshold check is not successful) and control is transferred to step124, Stop/recheck. An alarm and/or another indication (not shown in the figures) of a fault/abnormal operation of the motor is initiated. No further training/testing of the motor is performed until after the problem is found. When and if the problem is found, algorithm 100 is restarted with steps 102 and 104. Performance of the initial threshold check serves to save expending valuable resources and time training a motor that does not initially exhibit normal characteristics.

In another embodiment of the current invention, step 124 may include one or more additional thresholds as described hereinbelow with reference to FIGS. 7-11.

Referring presently to FIG. 5, algorithm 130 includes iterative steps (indicated by the integer value "L") to first train, then model, and to then routinely monitor the exemplary motor, in accordance with embodiments of the current invention.

In step 132 a calculation of $L-L_{min}$ is made where the value $L_{min}$ is an integer vale representing the minimum steps necessary for training.

$L_{min}$ is typically determined empirically from previous training attempts and/or from time and computing constraints. For example, $L_{min}$ may be determined to be the number of steps that yield approximately 48 to 96 hours of training and modeling. In the case of electric motors, typical values of may range from 50 to 200.

Three possible results for the calculation in step 132 are:
$L-L_{min}$<0, "training"; control is transferred to step 134;
$L-L_{min}$=0, "modeling"; control is transferred to step 136; and
$L-L_{min}$>0, "monitoring"; control is transferred to step 138.

Training—Step 134

The result of $L-L_{min}$<0 in step 132 yields continued training in step 134. Training is the first activity performed (typically repeated numerous times) to "teach" the algorithm specific features/characteristics of the signal of the previously-determined "normal" motor. Control is transferred to step 140, Form training feature table, as described hereinbelow in FIG. 6. (A training feature table is formed on the first iteration and successive spectrum information is added to it in each successive iteration.) Following step 140, L is incremented in step 142, L=L+1. Control is then returned to step 132 for another $L-L_{min}$ calculation, as described hereinabove.

Modeling—Step 136

When the result in step 132 of $L-L_{min}$=0, iterative training steps have been completed and a one-time modeling step is performed in step 136, Modeling. Modeling involves calculating one-dimensional second order and two dimensional second order polynomial coefficients from the training feature table of the previous step. This yields a coefficient vector ($\lambda$). The coefficient vector and the training feature table are collectively referred to hereinbelow as "modeled current information". The modeled current information serves as baseline information during subsequent routine monitoring (described hereinbelow) against which to compare instant operation status of the system being monitored.

Monitoring—Step 138

Following modeling step 136, control is then returned to step 132 for another $L-L_{min}$ calculation. When the result in step 132 of $L-L_{min}$>0 (i.e. starting with the iteration immediately following modeling) training and modeling steps described hereinabove are complete. Control is transferred to step 138, Monitoring, which includes, inter alia, instant current measurement and transformations, similar to those described hereinabove for the training step to determine an instant operation status, as described hereinbelow.

In step 143, Form instant feature table, data from the instant current measurements (similar to steps 102 through 116, as described hereinabove in FIG. 4) are used to form an instant feature table, as described hereinbelow in FIG. 6. The instant feature table is referred to hereinbelow as "instant current information".

Following step 143, a residual calculation is then performed in step 146, according to the relation, as known in the art:

$$\epsilon = y_{inst} - y_{train} = y_{inst} - x_{inst} \cdot \lambda,$$

where:
$\epsilon$ residual energy
$y_{inst}$ energy calculated from instant monitoring
$y_{train}$ energy calculated from training
$x_{inst}$ parameter matrix calculated from instant monitoring
$\lambda$ coefficient vector obtained from modeling At this point, control in algorithm 130 proceeds to step 148, "$\epsilon$ ?", where the value of residual energy calculated in step 146 hereinabove is evaluated with regard to two threshold values, T1 and T2. T1 is a first value, typically corresponding to 4$\sigma$ value of a residual distribution, as known in the art. Likewise, T2 is a second value, typically corresponding to 8$\sigma$ value of a residual distribution, as known in the art.

Possible results are:
$\epsilon$ <T1—yielding step 149, normal (the motor is evaluated as having a "normal" operation status);
$\epsilon$ >T2—yielding step 150, abnormal (the motor is evaluated as having an "abnormal" operation status); and
T1< $\epsilon$ <T2—yielding step 151, abnormal (the motor is evaluated as having a "marginal" operation status).

Typically, following step 149 ("normal") control in algorithm 130 may be transferred to step 138, to continue routine monitoring of the motor. Alternatively, monitoring may be presently stopped. Algorithm 130 may be initiated at step 138, when it is desirable to again continue routine monitoring of the motor.

Typically, following steps 150 ("abnormal") and 151 ("marginal") control in algorithm 130 may be transferred to step 138, to continue routine monitoring of the motor. However, because either an "abnormal" or "marginal" motor condition has been identified, more typically, motor operation is curtailed or stopped to perform motor maintenance/repair/replacement work and routine monitoring is likewise curtailed or stopped.

Reference is currently made to FIG. 6, which starts with step 144, Form feature table. Step 144 is essentially equivalent to steps 140 and 143, both previously mentioned in FIG. 5 with regard to training and to routine/instant monitoring. Feature extraction is known in the art and the following steps are summarized for purposes of clarity.

Current signals recorded in Phase 1 Time Domain, step 152, and Phase 2 Time Domain, step 154, serve to describe parameters of the exemplary 3-phase motor being monitored. The signals are compared with the respective power spectrums in steps 156 and 158, and the respective Features extraction Class II in steps, 165 and 166—which are equivalent steps (but refer, respectively, to phase 1 and phase 2 information). Energies of specific frequencies defined and are then calculated according to the expression:

$$\int_i y df;$$

where $\int_i y df$ is the integral of y spectra as a function of the frequency f at all i features.

In parallel, as indicated in the figure, following steps 152 and 154, a coherence spectrum is formed in step 164 and feature extraction class 1 is performed in step 167, in identical fashion to both steps performed and described hereinabove in step 118 of FIG. 4.

The two values corresponding to Feature extraction Class I of Step 167 are recorded in separated feature table in step 168. The separated feature table of step 168 also contains the features extracted from steps 165 and 166, as described hereinabove.

Values from the tabulated features extracted in steps 165 and 166 are then aggregated in step 170 Aggregation, to yield aggregated data, as known in the art. The resultant data is then recorded, in step 172, to yield a combined feature table, which includes the aggregated data and the two values corresponding to feature extraction Class I of Step 167, hereinabove.

Following step 170, control is reverted back to steps 140 and 143 of FIG. 5.

Reference is made to FIGS. 7-11, which are spectral coherence plots expressed in coherence 305 (abbreviated as "corr" in each plot) versus frequency 310, as part of the initial threshold check, as described in FIG. 4 hereinabove, in accordance with embodiments of the current invention. The spectral plots include those of: normal initial operation (plots 320 and 330 of FIGS. 7 and 8) and; abnormal initial operation status (plots 340, 350, and 360 of FIGS. 9-11) of an exemplary electric motor.

The values of coherence 305 shown range from 0 to 1 while the values of frequency 310 range from 0 to $2 \times 10^4$ (i.e. 20,000) Hz.

The plots shown in FIGS. 7-11 are based on the calculation of normalized correlation $C_{12}(f)$, as described hereinabove in step 118 of FIG. 4.

It can be seen that in normal initial operation (plots 320 and 330 of FIGS. 7 and 8) the coherence of 2 phases is naturally high at the trivial frequencies (for example: harmonics of an exemplary 50 Hz supply frequency i.e. 50, 100, and 150 Hz, etc.) while at other frequencies, the coherence has lower values.

Figure 9:
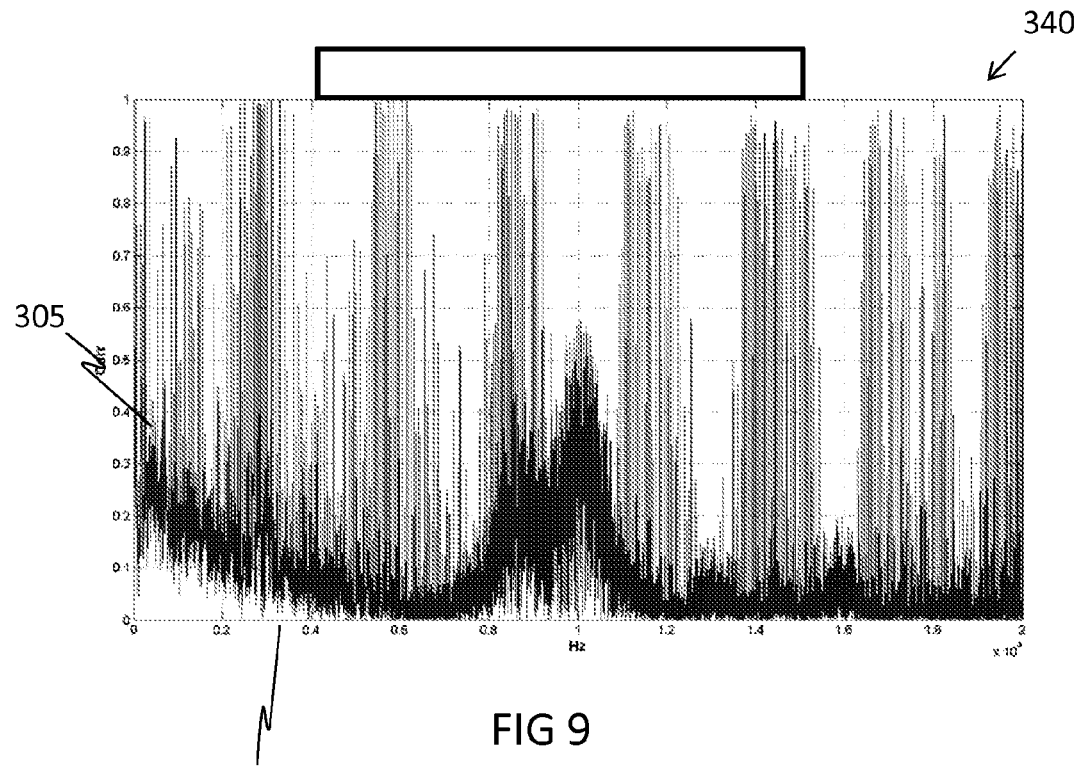
Figure 10:
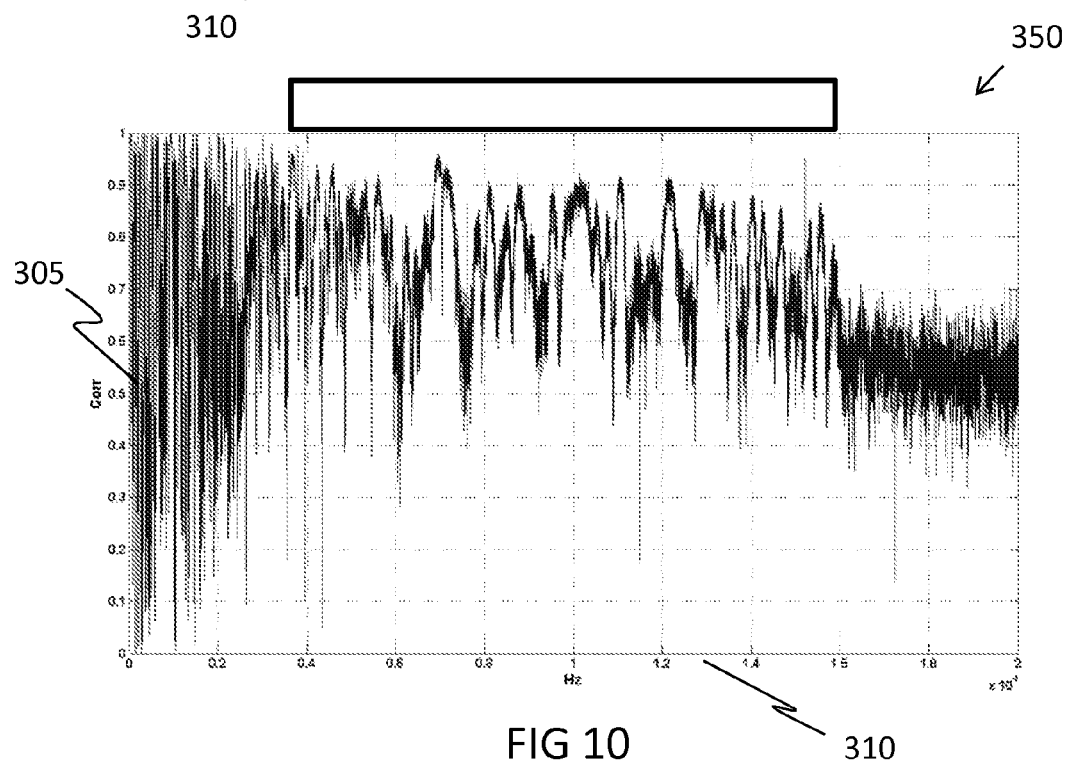
Figure 11:
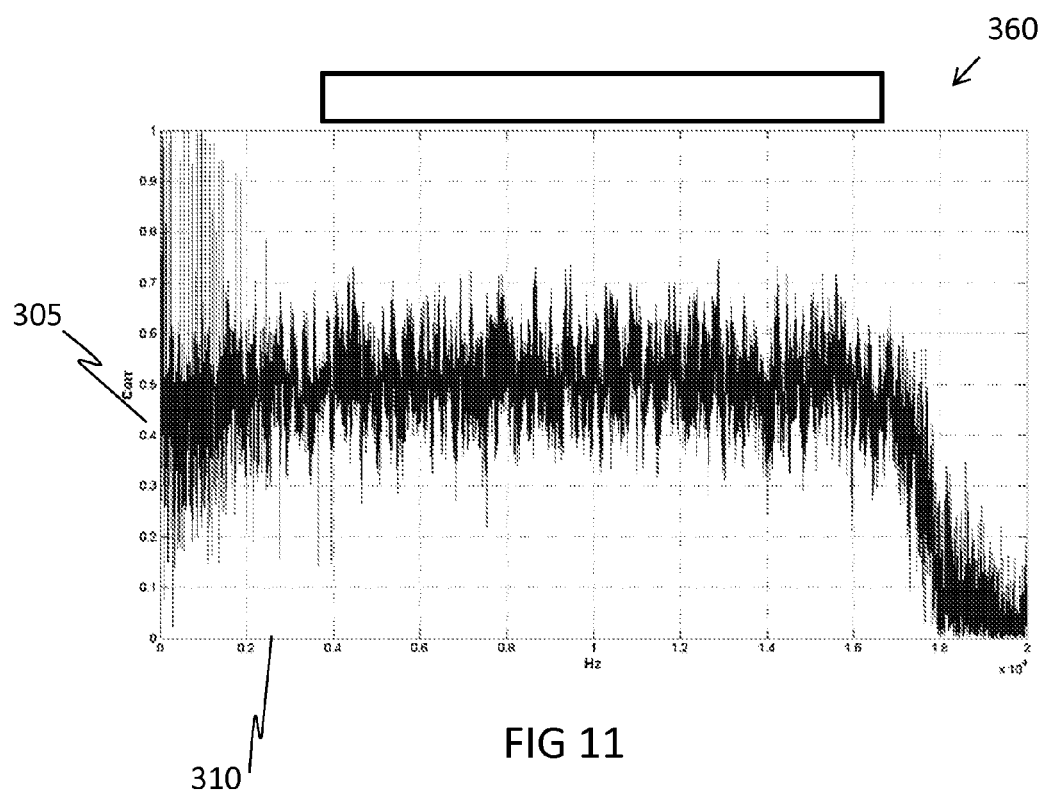

In plots 340, 350, and 360 of FIGS. 9-11, representing abnormal initial operation status of the motor, coherence at non-trivial frequencies is high, indicative of irregular operation on both phases simultaneously. The high coherence values of non-trivial frequencies in plots 340, 350, and 360 are much more significant than coherence levels of plots 320 and 330.

An RMS calculation may be made for each of the plots described hereinabove according to the expression:

$$RMSC = \sqrt{(\int C_{12}(f) df)}$$

Where f is evaluated between 0 and 400 orders (evaluated at a base frequency of 50 Hz, thereby yielding a range of 0 to 20 kHz) and only the non-trivial frequencies are included, meaning all frequencies except 50 Hz harmonics.

Referring again to FIG. 4, steps 122 and 124 respectively refer to successfully passing the initial threshold check and unsuccessfully passing the initial threshold check. Alternatively or alternatively, step 124 (stop/recheck) may be further subdivided to two steps not shown in thee figure: recheck; and stop, as discussed further hereinbelow.

It has been found that a direct determination of normal, marginal, and abnormal motor operation may be made from the RMSC values of plots similar to those shown and described in FIGS. 7-11 hereinabove, where:

RMSC<5 is indicative of a normal operation (i.e. step 122 of FIG. 4);
5≤RMSC≤10 is indicative or marginal operation; and
RMSC>10 is indicative of abnormal operation.

Embodiments of the monitoring system of the current invention have the following advantages:

No physical intervention or installation on the monitored machinery;
Relatively short learning period of the equipment is required;
No kinematic parameters of the rotating parts is required;
No need for RPM and voltage measurements;
Ability to diagnose new motors and repaired motors;
Provide near-immediate information regarding the monitored system following connection of the monitoring system;
The monitoring system has an electrical supply backup in case of electrical shutdown
Logging all raw data for at least two years
Need only two current sensors, obtaining higher performance and high sensitivity by using a physical model for cancelling load and environmental influence, and
The monitoring system is mounted in the monitored system electrical board, with no need for the monitoring system to be located at/next to the monitored system and/or shutting down the monitored system.

It is emphasized that whereas the system monitored by the monitoring system has been described hereinabove as an exemplary electrical motor and/or rotating equipment, embodiments of the current invention include monitoring any electrically-connected device or system which is: a) electrically powered; b) provides/generates electrical power; or c) has characteristics of a combination of being electrically powered and providing electrical power.

It will be appreciated that the above descriptions are intended only to serve as examples, and that many other embodiments are possible within the scope of the present invention as defined in the appended claims.

The invention claimed is:
1. A method for monitoring a system having an electrical connection, the connection having at least two phases and respective currents, the system having a periodic behavior, the method comprising the steps of:
- connecting sensors to measure respective currents of two phases of the electrical connection and transferring the measured current information to a PC host;
- using the PC host to transform the measured currents and to create initial current information whereby the initial current information includes: a normalized correlation frequency spectrum, derived from the cross power spectrum of the at least two phases; a non-trivial frequency spectrum derived from the normalized frequency spectrum; and a root-mean-square calculation of the non-trivial frequency spectrum;
- making an initial determination of a normal operation of the system using the PC host;
- operating the PC host to perform training and modeling of the system, following the initial determination of normal operation of the system, the training and modeling of the system including further current measurements yielding modeled current information;
- monitoring the system, which includes performing instant current measurements of the system and using the PC host to yield instant current information indicative of instant operation status of the system; and
- making an instant determination of operation status of the system by using the PC host to compare the instant current information with the modeled current information.

2. The method of claim 1, whereby the initial determination of normal operation of the system further comprises an initial threshold check whereby the root mean-square of the non-trivial spectrum is compared to a threshold value.

3. The method of claim 2, whereby no training, modeling, and monitoring of the system are performed when the initial threshold check is not successful.

4. The method of claim 2, whereby the initial determination of normal operation of the system is completed in a time period ranging substantially from 30 to 180 minutes.

5. The method of claim 4, whereby modeled current information includes a coefficient vector and a training feature table.

6. The method of claim 5, whereby instant current information includes an instant feature table.

7. The method of claim 6, whereby a residual energy is calculated based on the instant current information and the modeled current information and the residual energy is compared to at least one threshold to make the instant determination of operation status.

8. The method of claim 1, whereby training and modeling is completed in a time period ranging substantially from 36 to 100 hours.

9. A monitoring system for monitoring a system having an electrical connection, the connection having at least two phases and respective currents, the system having a periodic behavior, the monitoring system comprising:
- at least two current sensors configured to be connected to the at least two phases and to measure respective currents of the at least two phases;
- an A-to-D converter connected to the current sensors and configured to digitize the measured currents;
- a PC host connected to the A-D converter and configured to process the digitized measured currents to:
  - create initial current information indicative of initial normal operation of the system wherein the initial current information includes: a normalized correlation frequency spectrum derived from the cross power spectrum of the at least two phases; a non-trivial frequency spectrum derived from the normalized frequency spectrum; and a root-mean-square calculated from the non-trivial frequency spectrum;
  - perform training and modeling of the system, following the indication of normal operation of the system, to yield modeled current information; and
  - monitor the system with instant current measurements to yield instant current information indicative of instant operation status of the system
- wherein the monitoring system is configured to make a determination of instant operation status of the system based on a comparison of the instant current information with the modeled current information.

10. The monitoring system of claim 9, wherein normal operation of the system is determined based upon a comparison of the root mean-square and a threshold value.

11. The monitoring system of claim 10, wherein the indication of initial normal operation of the system is completable in a time period ranging substantially from 30 to 180 minutes.

12. The monitoring system of claim 10, wherein modeled current information includes; a coefficient vector and; a training feature table.

13. The monitoring system of claim 12, wherein instant current information includes and an instant feature table.

14. The monitoring system of claim 13, wherein a residual energy is calculable, based on the instant current information and the modeled current information.

15. The monitoring system of claim 14, wherein the instant operation status of the system is determinable based upon a comparison of the residual energy and at least one threshold.

* * * * *